(12) United States Patent
Wang

(10) Patent No.: US 6,710,662 B2
(45) Date of Patent: Mar. 23, 2004

(54) POWER AMPLIFIER WITH IMPROVED LINEARITY AND REDUCED TRANSISTOR STACKS

(75) Inventor: Sung-ho Wang, Seoul (KR)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/245,832

(22) Filed: Sep. 16, 2002

(65) Prior Publication Data

US 2003/0112076 A1 Jun. 19, 2003

Related U.S. Application Data

(63) Continuation of application No. 10/105,074, filed on Mar. 22, 2002, now abandoned.

(30) Foreign Application Priority Data

Mar. 22, 2001 (KR) ................................ 10-2001-0014784

(51) Int. Cl.[7] .................................................. H03F 3/68
(52) U.S. Cl. ............... 330/295; 330/124 R; 330/124 D; 330/129; 330/131; 330/134; 330/296
(58) Field of Search ..................... 330/124 R, 124 D, 330/129, 131, 134, 296, 295

(56) References Cited

U.S. PATENT DOCUMENTS 3,449,685 A * 6/1969 Holmes ................. 330/124 R
4,117,418 A * 9/1978 Hoglund ................. 330/124 R
5,694,085 A * 12/1997 Walker ....................... 330/295

FOREIGN PATENT DOCUMENTS

JP 359072209 * 4/1984

OTHER PUBLICATIONS

Staert et al, "A 2v CMOS Cellular Tranceiver Print End" IEEE Solid–State Circuit, Conference 2000 pp 142–143, 450.*

Holt "Electronic Circuits" John Wiley & Sons 1978 pp 635–637.*

* cited by examiner

Primary Examiner—Michael B. Shingleton
(74) Attorney, Agent, or Firm—Van Pelt & Yi LLP

(57) ABSTRACT

A power amplifier includes drains and sources of a plurality of transistors connected to each other to produce a plurality of common drains and a plurality of common sources, wherein the common drains are connected at a common drain point and wherein the common drain point is connected via an RF choke to a power supply voltage terminal and wherein the common sources are grounded; an output terminal connected to the RF choke; a plurality of bias terminals each coupled via a resistor to the gate of one of the plurality of transistors wherein each of the gates of the plurality of transistors is also capacitively coupled to a radio frequency input.

3 Claims, 6 Drawing Sheets

POWER AMPLIFIER WITH IMPROVED LINEARITY AND REDUCED TRANSISTOR STACKS

CROSS REFERENCE TO RELATED APPLICATIONS

This application is a continuation of U.S. patent application Ser. No. 10/105,074 entitled POWER AMPLIFIER AND METHOD FOR IMPROVING LINEARITY OF THE AMPLIFIER filed Mar. 22, 2002, now abandoned which is incorporated herein by reference for all purposes, which claims priority to Korean Patent Application No. KR 10-2001-0014784, filed Mar. 22, 2001, which is incorporated herein by reference for all purposes.

FIELD OF THE INVENTION

The present invention relates generally to a power amplifier with improved linearity. More specifically, a high-output power amplifier that can control power to reduce power consumption with improved linearity that is applied to the transmitter unit of a radio communication system is disclosed.

BACKGROUND OF THE INVENTION

Power amplifiers are widely used in electronic devices, particularly wireless communications systems. Generally, the power amplifier in a transmitter of a wireless communication system should be capable of adjusting the output power to minimize power consumption.

FIG. 1 is a circuit diagram that illustrates an example of an existing high-output power amplifier (HPF). As illustrated in the figure, transistors 10, 11 are connected in series, where the drain of transistor 10 is connected via an RF choke L to a power source VDD, with Bias 1 applied to its gate and an output terminal Out connected to the common point of the RF choke L and the drain of the transistor 10. The gate of the transistor 11 is connected via a capacitor C to an RF input terminal RFIN, with its source grounded and Bias 2 applied to the common point of the transistor 11 and the capacitor C via a resistor R.

An existing high-output power amplifier of the above configuration is usually manufactured with chemical compound semiconductors such as gallium arsenide (GaAs). However, since the manufacturing process is not well developed, methods of power control are not either. Also, since transistor gain is adjusted by controlling the bias voltage directly from outside, the transistor is basically a voltage controlled current source, and thus the gain change is too sensitive with regard to the controlled voltage. Additionally, the gain may not be constant based on samples due to changes in threshold voltage Vt caused by process changes.

FIG. 2 is a circuit diagram that illustrates another example of an existing high-output power amplifier. As illustrated in the figure, transistors 21–24 are connected in parallel, where an input terminal Input is connected to each gate of transistors 21–24. The sources of transistors 21–24 are grounded. Switch transistors 25–28 are used to interrupt the power source VDD supplied to the drain of each transistor 21–24 according to external control signals. Here, the symbol L represents a RF choke, C represents a capacitor, and W represents the circuit line width that is the reference size of each transistor.

An existing high-output power amplifier of the above configuration has been manufactured using a CMOS process technique to make up for defects in the power amplifier circuits of chemical compound semiconductors shown in FIG. 1. Although the power control is relatively constant and stable, another transistor stack is required to form the switch transistor 25–28 for power control for manufacturing using the CMOS technique. A stack increase as in this example lowers the saturation margin of the circuit when the voltage supply is low, and sacrifices gain and linearity.

It would be useful if an improved power amplifier could be developed that avoids the problems described above.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1:
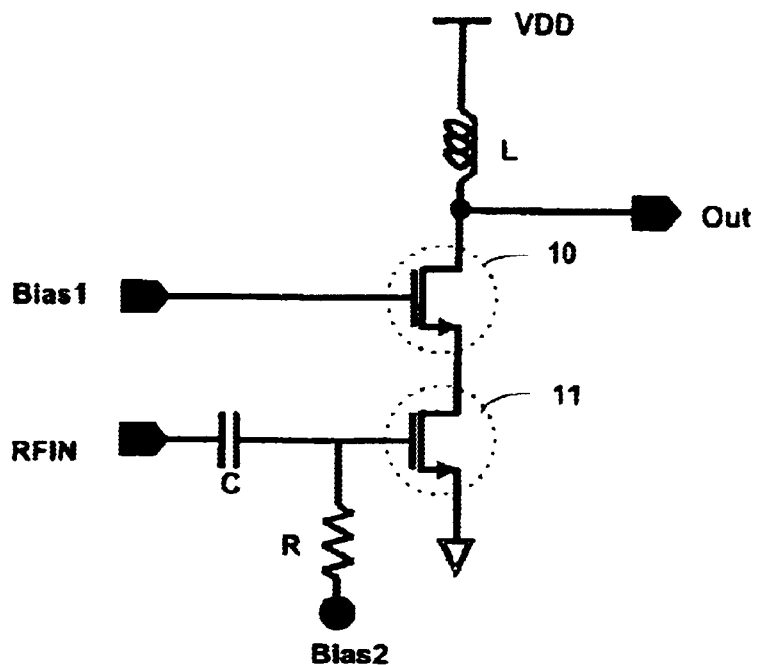
FIG. 1 is a circuit diagram illustrating an example of an existing high-output power amplifier (HPF).

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

The techniques described below resolve the existing problems described above, and provide a power amplifier with improved linearity while reducing transistor stacks. The disclosed power amplifier is characterized in its composition of several transistors, where drains and sources are connected to each other, with common drains connected via an RF choke to a power supply voltage terminal, an output terminal connected to the common point of the common drains and the RF choke, the common sources grounded, gates of the several transistors jointly connected via each capacitor respectively to a radio frequency input terminal, and each common point of the gates and the capacitors connected via each resistor respectively to the corresponding bias terminals.

The power amplifier may also include an additional transistor, where the drain is connected to the common point of the RF choke and the output terminal, the source connected to the common drains, and the gate connected to another bias terminal.

Improved linearity of the power amplifier is achieved by controlling bias voltages applied from the corresponding bias terminals to have different magnitudes corresponding to the sizes of the several transistors in the order of parallel connection in the power amplifier, where drains and sources of its transistors are connected to each other, with common drains connected via an RF choke to a power supply voltage terminal, an output terminal connected to the common point of the common drains and the RF choke, the common sources grounded, gates of the several transistors jointly connected via each capacitor respectively to a radio frequency input terminal, and each common point of the gates and the capacitors connected via each resistor respectively to the corresponding bias terminals.

Figure 3:
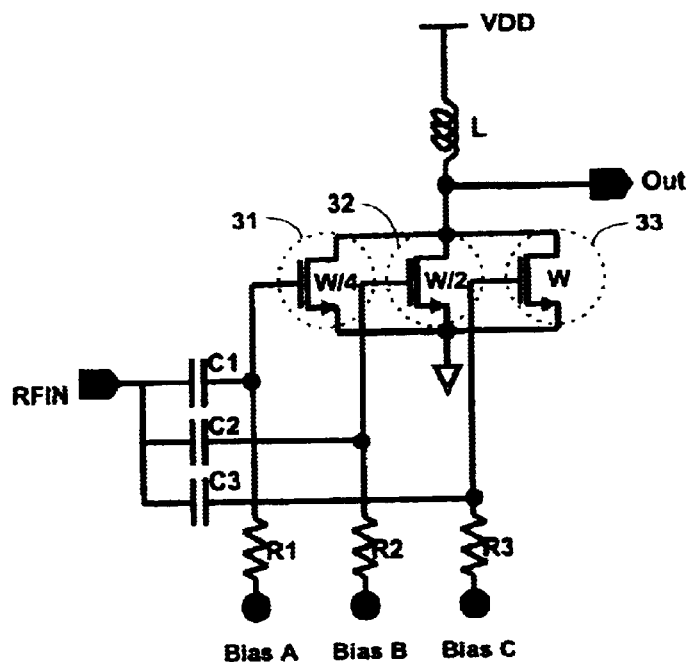
FIG. 3 is a circuit diagram of a power amplifier in accordance with a first embodiment.

FIG. 3 is a circuit diagram of the power amplifier in accordance with a first embodiment. As illustrated in the figure, the power amplifier has transistors 31–33, of which the circuit line width is W/4, W/2 and W respectively as the reference size in manufacturing using the CMOS process, where the drains and sources of the transistors 31, 32, and 33 are connected to each other, with the common drains connected via an RF choke L to a power supply voltage terminal VDD. An output terminal Out is connected to the common point of the common drains and RF choke L. The common sources are grounded. The gate of the transistor 31 is connected via capacitor C1 to a radio frequency input terminal RFIN. The gate of the transistor 32 is connected via capacitor C2 to radio frequency input terminal RFIN. The gate of the transistor 33 is connected via capacitor C3 to the radio frequency input terminal RFIN. The common point of the gate of transistor 31 and capacitor C1 are connected via resistor R1 to bias terminal Bias A. The common point of the gate of transistor 32 and capacitor C2 are connected via resistor R2 to bias terminal Bias B. The common point of the gate of transistor 33 and capacitor C3 are connected via resistor R3 to bias terminal Bias C.

The operation of the power amplifier that is configured in FIG. 3 is described as follows. Transistors 31, 32 and 33 are turned on and off according to the bias voltage applied to each gate through the bias terminals Bias A, Bias B, Bias C. For example, if the bias voltage applied is 0 V, the corresponding transistor is turned off, and if the bias voltage changes to any working voltage, the corresponding transistor—is turned on. That is, the bias voltages applied through the bias terminals Bias A, Bias B, Bias C control the operations of the transistors 31–33 to be turned on/off respectively, acting as the control bit for power control.

Figure 4:
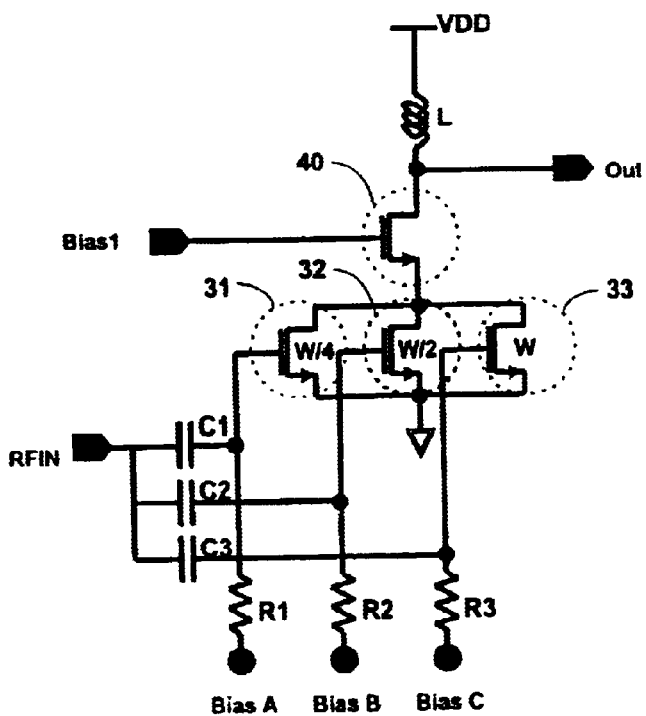
FIG. 4 is a circuit diagram of a power amplifier in accordance with a second embodiment.

FIG. 4 is a circuit diagram of a power amplifier in accordance with a second embodiment. Its configuration is the same as in FIG. 3, except that there is a fourth transistor 40, which is connected to the common point of RF choke L and output terminal Out, with its source connected to the common drains and its gate connected to another bias terminal Bias1. That is, FIG. 4 is a cascode amplifier of the amplifier in FIG. 3. The power amplifier in FIG. 4 has the advantage of a cascode amplifier, in comparison to an existing power amplifier as in FIG. 2, without requiring an additional transistor stack in the CMOS manufacturing process.

Figure 5:
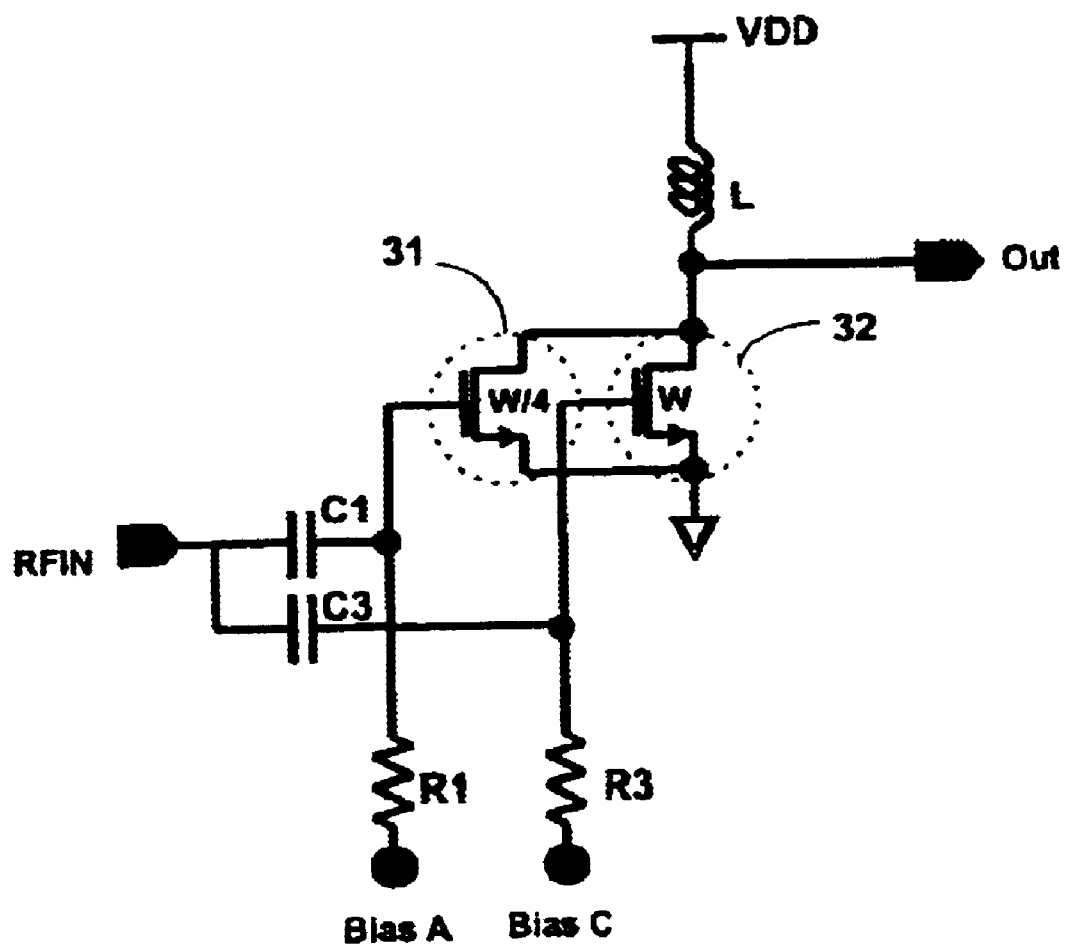
FIG. 5 is a circuit diagram illustrating improving the linearity of a power amplifier as shown in FIG. 3.

FIG. 5 is a circuit diagram illustrating the improved linearity of the power amplifier in FIG. 3. For the sake of convenience of explanation, this figure illustrates an example composed of transistors 31 and 33 in parallel connection with the relative circuit line width of W/4 and W, without transistor 32 in the circuit of FIG. 3. If the bias voltage applied to the transistor 31 through Bias A is different in magnitude from the bias voltage applied to the transistor 33 through Bias C by an arbitrary size of $\Delta V$, then the smaller transistor 31 can fill up the decrease in mutual conductance (Gm) of the larger transistor 33 to improve the linearity of the amplifier.

Figure 6:
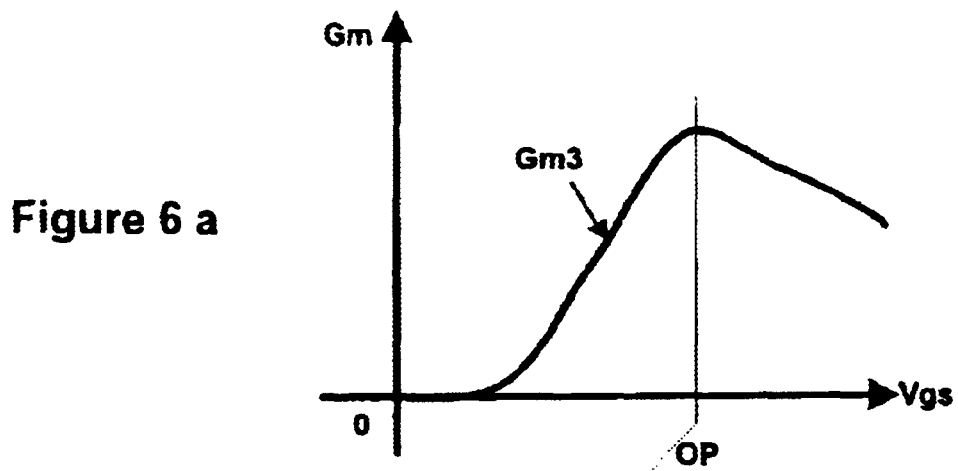
FIGS. 6a–6c show mutual conductance graphs of transistors illustrating improving the linearity of a power amplifier.
Figure 6:
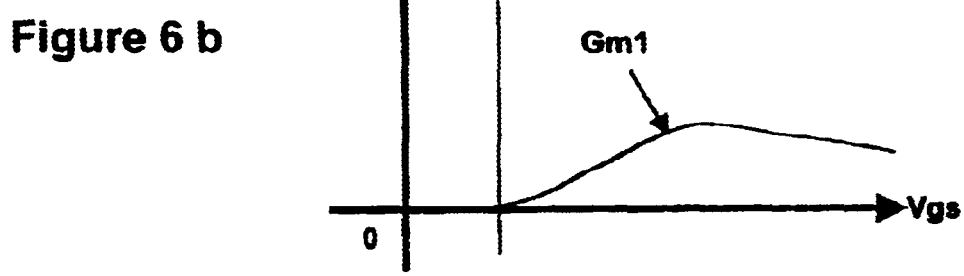
Figure 6:
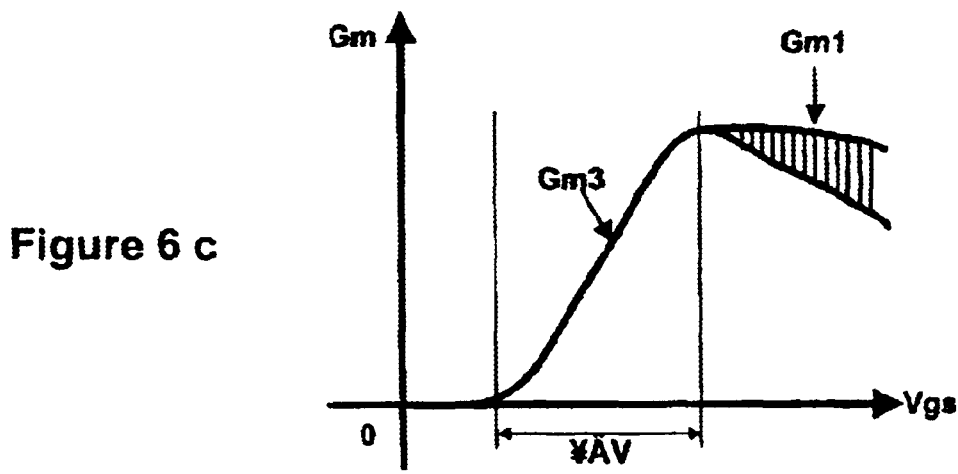

FIG. 6a is the graph of Gm3 corresponding to a situation when Bias C is applied to the gate of the transistor 33 and FIG. 6b is the graph of Gm1 corresponding to a situation when Bias A (where Bias A=Bias B−$\Delta V$) is applied to the gate of transistor 31, which is relatively smaller than transistor 33, then as illustrated in FIG. 6c, transistor 31 is turned on (OP) at the moment when Gm3 of the transistor 33 begins to decrease (OP) so that Gm1 fills up the decrease in Gm3 of the transistor 33.

Figure 7:
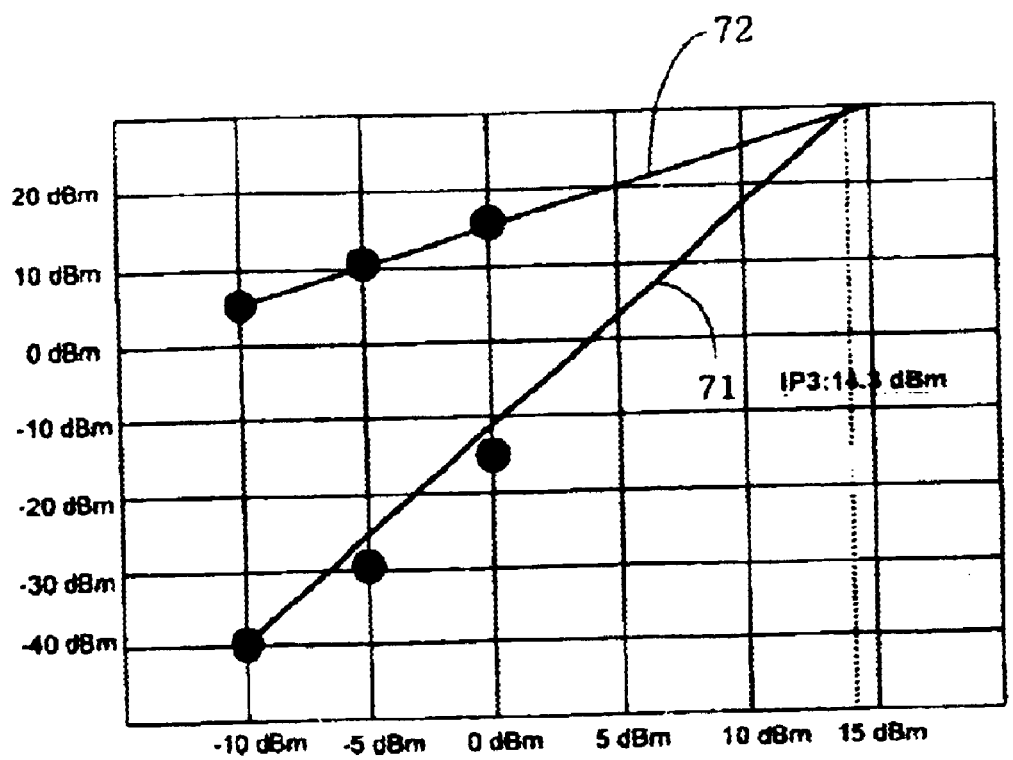
FIG. 7 is a graph showing the linearity of the power amplifier.

The described power amplifier with improved linearity is effective in reducing the transistor stacks and improving the linearity of the power amplifier in manufacturing using the CMOS process, in comparison to existing high-output power amplifiers. FIG. 7 is a graph showing the linearity of the power amplifier. In this figure, the point where lines 71 and 72 meet is IP3. The input IP3 property is good at about +14 dBm.

Figure 8:
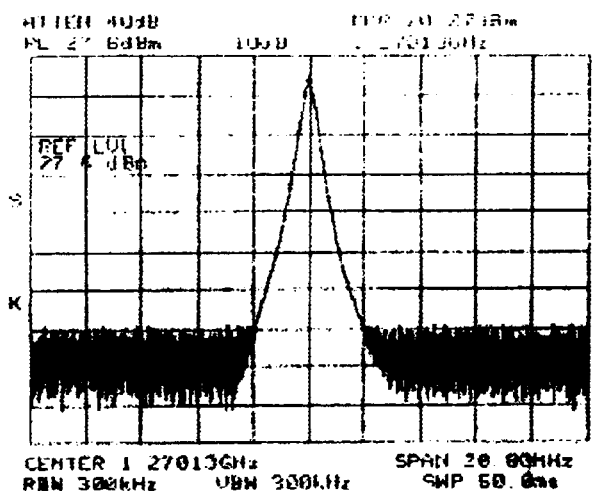
FIGS. 8a–8c show graphs of power control test results of the power amplifier.
Figure 8:
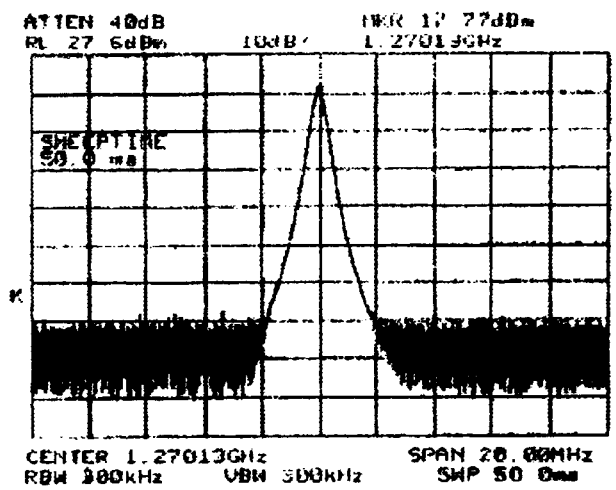
Figure 8:
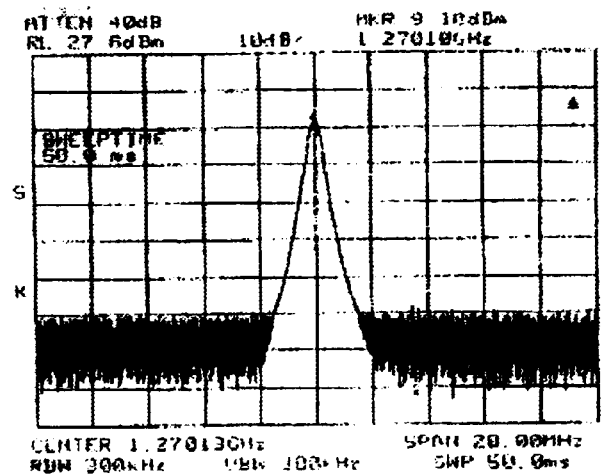

FIG. 8 shows the results of power control tests on the power amplifier. FIG. 8a is the result of the output spectrum at maximum power control mode. FIG. 8b is the result of the output spectrum at medium power control mode. FIG. 8c is the result of the output spectrum at minimum power control mode.

Figure 2:
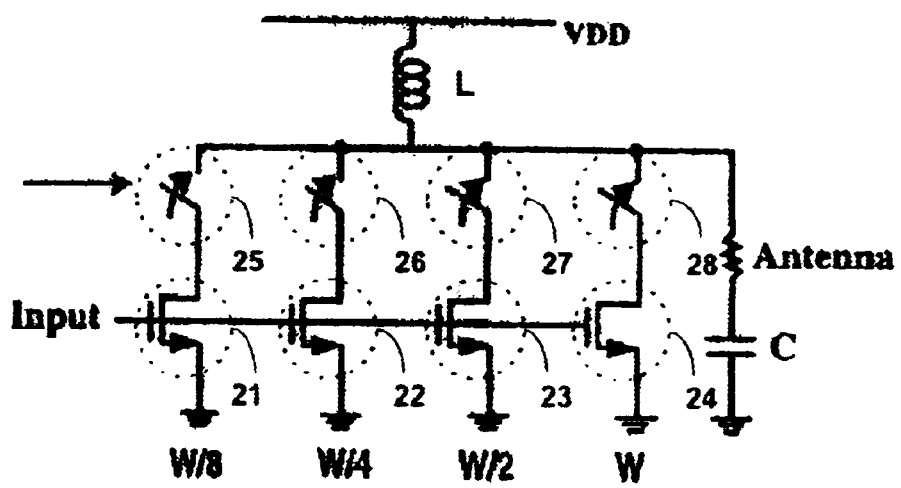
FIG. 2 is a circuit diagram illustrating an example of an existing high-output power amplifier.

The improved design causes the transistors to maintain a good saturation margin even with a low voltage supply by eliminating one layer of the transistor stack from the existing model in FIG. 2, and creates the effect of reducing three layers of transistor stacks of a cascode amplifier to two layers. Also, when using a larger transistor and a smaller transistor, if the bias voltages are made to be different, Gm of the smaller transistor increases when Gm of the larger transistor decreases, creating the effect of improving the overall linearity of the amplifier.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A power amplifier including:
    a plurality of transistors, characterized by different sizes and configured in parallel in decreasing order to their relative sizes, having drains connected to each other to produce a plurality of common drains and sources connected to each other to produce a plurality of common sources, wherein the common drains are connected at a common drain point and wherein the common drain point is connected via an RF choke to a power supply voltage terminal and wherein the common sources are grounded;

an output terminal connected to the RF choke;

a plurality of bias terminals each coupled via a resistor to the gate of one of the plurality of transistors wherein each of the gates of the plurality of transistors is also capacitively coupled to a radio frequency input.

2. A power amplifier as recited in claim 1 further including an additional transistor, having an additional drain and an additional source and an additional gate wherein the additional source is connected to the common drain point, and wherein the additional drain is connected to the RF choke and the output terminal and wherein the additional gate is connected to an additional bias terminal.

3. A method for improving the linearity of a power amplifier including:

connecting a plurality of transistors, characterized by different sizes and configured in parallel in decreasing order to their relative sizes, having a plurality of drains and a plurality of sources and a plurality of gates in parallel in the decreasing order of their relative sizes;

operating the power amplifier controlling a plurality of bias voltages applied from the a plurality of bias terminals having different magnitudes corresponding to the sizes of the several transistors in the order of parallel connection;

wherein the drains and sources are connected to each other to form common drains and common sources and wherein the common drains are connected via an RF choke to a power supply voltage terminal and wherein an output terminal is connected to the common drains and the RF choke and wherein the common sources are grounded and wherein the plurality of gates are each capacitively coupled to a radio frequency input terminal and wherein the plurality of gates are each coupled to one of the plurality of bias terminals via a resistor.

* * * * *